US010672876B2

(12) United States Patent
Tanimoto (10) Patent No.: US 10,672,876 B2
(45) Date of Patent: Jun. 2, 2020

(54) FIELD-EFFECT TRANSISTOR HAVING A BYPASS ELECTRODE CONNECTED TO THE GATE ELECTRODE CONNECTION SECTION

(71) Applicant: NICHIA CORPORATION, Anan-shi (JP)

(72) Inventor: Masashi Tanimoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/807,578

(22) Filed: Nov. 9, 2017

(65) Prior Publication Data
US 2018/0151675 A1 May 31, 2018

(30) Foreign Application Priority Data

Nov. 29, 2016 (JP) ................. 2016-230768

(51) Int. Cl.
*H01L 29/40* (2006.01)
*H01L 29/778* (2006.01)
(Continued)

(52) U.S. Cl.
CPC ........ *H01L 29/402* (2013.01); *H01L 29/0891* (2013.01); *H01L 29/205* (2013.01);
(Continued)

(58) Field of Classification Search
CPC . H01L 29/402; H01L 29/2003; H01L 29/205; H01L 29/42316; H01L 29/7787;
(Continued)

(56) References Cited

U.S. PATENT DOCUMENTS 4,879,582 A * 11/1989 Kimura ............. H01L 29/42312
257/364
5,942,773 A * 8/1999 Kaneko ............. H01L 29/42316
257/192
(Continued)

FOREIGN PATENT DOCUMENTS

| JP | 2008-021949 | 1/2008 |
| JP | 2011-210834 | 10/2011 |
| JP | 2015-002267 | 1/2015 |

*Primary Examiner* — Allen L Parker
*Assistant Examiner* — Charles N Ausar-El
(74) *Attorney, Agent, or Firm* — Mori & Ward, LLP (57) ABSTRACT

A field-effect transistor includes a source electrode, a drain electrode, a semiconductor structure including a channel provided between the source electrode and the drain electrode in a first direction. Gate main portions have a first gate main portion length in the first direction and a second gate main portion length in a second direction. Connection portions are alternatively connected to the gate main portions respectively in the second direction. Each of the connection portions has a first connection portion length in the first direction and a second connection portion length in the second direction. The first connection portion length is longer than the first gate main portion length. The second connection portion length is shorter than the second gate main portion length. An external connection section is to apply electric power to the gate electrode. A bypass electrode connects the external connection section to each of the connection portions.

11 Claims, 11 Drawing Sheets

(51) Int. Cl.
*H01L 29/423* (2006.01)
*H01L 29/205* (2006.01)
*H01L 29/417* (2006.01)
*H01L 29/08* (2006.01)
*H01L 29/20* (2006.01)

(52) U.S. Cl.
CPC .. *H01L 29/41766* (2013.01); *H01L 29/42316* (2013.01); *H01L 29/7786* (2013.01); *H01L 29/7787* (2013.01); *H01L 29/2003* (2013.01)

(58) Field of Classification Search
CPC .......... H01L 29/0891; H01L 29/41766; H01L 29/7786
See application file for complete search history.

(56) References Cited

U.S. PATENT DOCUMENTS

| | | | | |
|---|---|---|---|---|
| 6,020,613 | A * | 2/2000 | Udomoto | H01L 21/28587 257/341 |
| 6,023,086 | A * | 2/2000 | Reyes | H01L 23/4824 257/287 |
| 6,765,268 | B2 * | 7/2004 | Akamine | H01L 23/4824 257/368 |
| 7,550,821 | B2 * | 6/2009 | Shibata | H01L 24/05 257/615 |
| 7,560,346 | B2 * | 7/2009 | Igarashi | H01L 27/0207 257/319 |
| 8,344,463 | B2 * | 1/2013 | Yanagihara | H01L 23/481 257/141 |
| 8,592,919 | B2 * | 11/2013 | Inoue | H01L 29/42316 257/401 |
| 8,987,838 | B2 | 3/2015 | Tanimoto | |
| 9,136,263 | B2 * | 9/2015 | Koyama | H01L 27/0277 |
| 9,166,009 | B2 * | 10/2015 | Ishikura | H01L 29/2003 |
| 9,293,456 | B2 * | 3/2016 | Nita | H01L 27/088 |
| 9,379,231 | B2 * | 6/2016 | Briere | H01L 29/7788 |
| 9,461,158 | B2 * | 10/2016 | Fujii | H01L 29/205 |
| 9,786,660 | B1 * | 10/2017 | Farrell | H01L 27/088 |
| 9,859,411 | B2 * | 1/2018 | Suzuki | H01L 29/778 |
| 9,947,616 | B2 * | 4/2018 | Wood | H01L 23/5221 |
| 10,128,365 | B2 * | 11/2018 | Fayed | H01L 29/7786 |
| 2002/0140024 | A1 * | 10/2002 | Aoki | H01L 29/0692 257/327 |
| 2002/0180005 | A1 * | 12/2002 | Haematsu | H01L 21/768 257/621 |
| 2003/0132460 | A1 * | 7/2003 | Tabuchi | H01L 21/823885 257/213 |
| 2004/0164407 | A1 * | 8/2004 | Nakajima | H01L 23/3107 257/724 |
| 2005/0116257 | A1 * | 6/2005 | Oakes | H01L 23/4824 257/213 |
| 2006/0071304 | A1 * | 4/2006 | Jagannathan | H01L 29/78 257/659 |
| 2006/0081985 | A1 * | 4/2006 | Beach | H01L 29/0692 257/745 |
| 2006/0091480 | A1 * | 5/2006 | Desko | H01L 23/4824 257/401 |
| 2007/0120153 | A1 * | 5/2007 | Williams | H01L 21/8252 257/280 |
| 2007/0202360 | A1 * | 8/2007 | Chaudhari | H01L 29/41758 428/698 |
| 2007/0228424 | A1 * | 10/2007 | Igarashi | H01L 27/0207 257/256 |
| 2008/0157222 | A1 * | 7/2008 | Wang | H01L 27/0207 257/401 |
| 2009/0152649 | A1 * | 6/2009 | Kim | H01L 29/0619 257/409 |
| 2009/0256210 | A1 * | 10/2009 | Matsushita | H01L 27/0251 257/379 |
| 2012/0001230 | A1 * | 1/2012 | Takatani | H01L 21/76895 257/194 |
| 2012/0080729 | A1 * | 4/2012 | Fujikawa | H01L 29/7833 257/288 |
| 2013/0062625 | A1 * | 3/2013 | Takada | H01L 29/41758 257/77 |
| 2014/0124867 | A1 * | 5/2014 | Kaibara | H01L 23/4824 257/368 |
| 2014/0367797 | A1 * | 12/2014 | Tanimoto | H01L 27/105 257/401 |
| 2015/0035080 | A1 * | 2/2015 | Matsumoto | H01L 27/088 257/390 |
| 2015/0311332 | A1 * | 10/2015 | Zhang | H01L 24/06 257/76 |
| 2017/0047438 | A1 * | 2/2017 | Simin | H01L 29/402 |
| 2017/0104064 | A1 * | 4/2017 | Aoki | H01L 29/7786 |
| 2017/0148783 | A1 * | 5/2017 | Bettencourt | H03F 1/56 |
| 2017/0271258 | A1 * | 9/2017 | Wood | H01L 23/5221 |
| 2017/0271497 | A1 * | 9/2017 | Fayed | H01L 29/7786 |
| 2017/0345920 | A1 * | 11/2017 | Nagahisa | H01L 29/41 |
| 2018/0090476 | A1 * | 3/2018 | Kamada | H01L 29/7786 |
| 2018/0374943 | A1 * | 12/2018 | Liu | H01L 29/7787 |
| 2019/0088772 | A1 * | 3/2019 | Fayed | H01L 29/7786 |

* cited by examiner

FIELD-EFFECT TRANSISTOR HAVING A BYPASS ELECTRODE CONNECTED TO THE GATE ELECTRODE CONNECTION SECTION

CROSS-REFERENCE TO RELATED APPLICATIONS

The present application claims priority under 35 U.S.C. § 119 to Japanese Patent Application No. 2016-230768, filed Nov. 29, 2016. The contents of this application are incorporated herein by reference in their entirety.

BACKGROUND OF THE INVENTION

Field of the Invention

The present invention relates to a field-effect transistor.

Discussion of the Background

A field-effect transistor includes: a semiconductor layer having a channel; and a source electrode, a drain electrode, and a gate electrode each connected to the semiconductor layer. These electrodes are arranged as disclosed in, for example, Japanese Unexamined Patent Application Publication No. 2011-210834. Specifically, the source electrode and the drain electrode each having a comb shape are arranged alternately so as to engage with each other, and the gate electrode is arranged between the source electrode and the drain electrode.

SUMMARY OF THE INVENTION

According to one aspect of the present invention, a field-effect transistor includes a source electrode, a drain electrode, a semiconductor structure, a gate electrode, an external connection section, and a bypass electrode. The semiconductor structure includes a channel provided between the source electrode and the drain electrode in a first direction. The gate electrode includes gate main portions and connection portions. The gate main portions have a first gate main portion length in the first direction and a second gate main portion length in a second direction intersecting with the first direction. The connection portions are alternatively connected to the gate main portions respectively in series in the second direction. Each of the connection portions has a first connection portion length in the first direction and a second connection portion length in the second direction. The first connection portion length is longer than the first gate main portion length. The second connection portion length is shorter than the second gate main portion length. The external connection section is connected to an end of the gate electrode in the second direction to apply electric power to the gate electrode. The bypass electrode connects the external connection section to each of the connection portions.

According to another aspect of the present invention, a field-effect transistor includes a source electrode, a drain electrode, a semiconductor structure, a gate electrode, an external connection section, and a bypass electrode. The semiconductor structure includes a channel provided between the source electrode and the drain electrode in a first direction. The gate electrode includes gate main portions and connection portions. The gate main portions extend in respective extending directions. The connection portions are connected to the gate main portions respectively in series in the respective extending directions. Each of the connection portions is connected to an adjacent gate main portion among the gate main portions. The adjacent gate main portion has a first gate main portion length in the first direction and a gate main portion extending direction length in an extending direction thereof among the respective extending directions. Each of the connection portions having a first connection portion length in the first direction and a connection portion extending direction length in the extending direction. The first connection portion length is longer than the first gate main portion length. The connection portion extending direction length is shorter than the gate main portion extending direction length. The external connection section is connected to an end of the gate electrode along the respective extending directions to apply electric power to the gate electrode. The bypass electrode connects the external connection section to each of the connection portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Embodiments of the present invention will be described below with reference to the drawings. Embodiments to be described below are intended to embody the technological concept of the present invention and are not intended to limit the scope of the present invention. In the following, the same designations or the same reference numerals may, in principle, denote the same or like members and duplicative descriptions will be appropriately omitted.

Figure 1A:
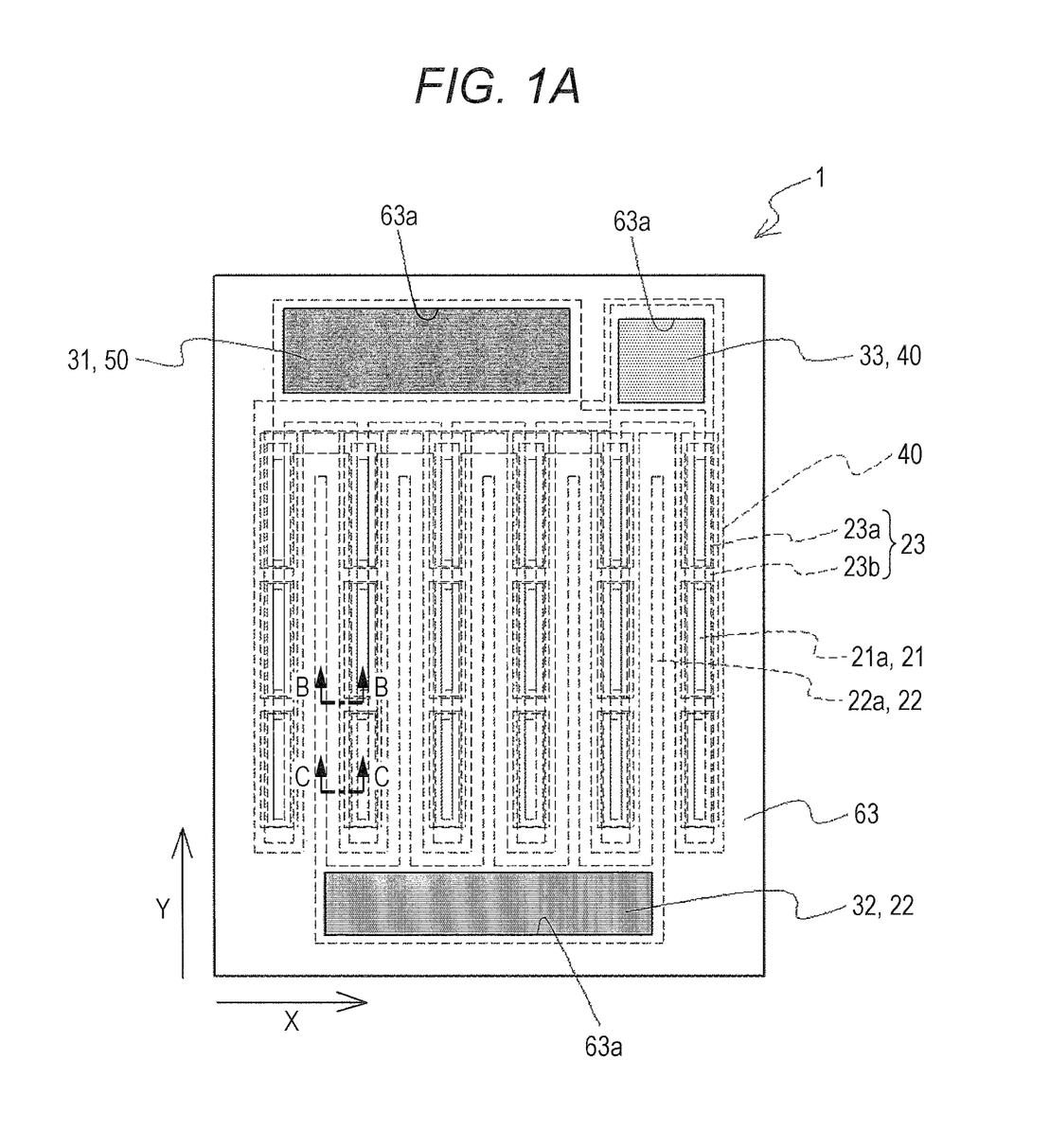
FIG. 1A is a schematic plan view of a field-effect transistor according to an embodiment.
Figure 1B:
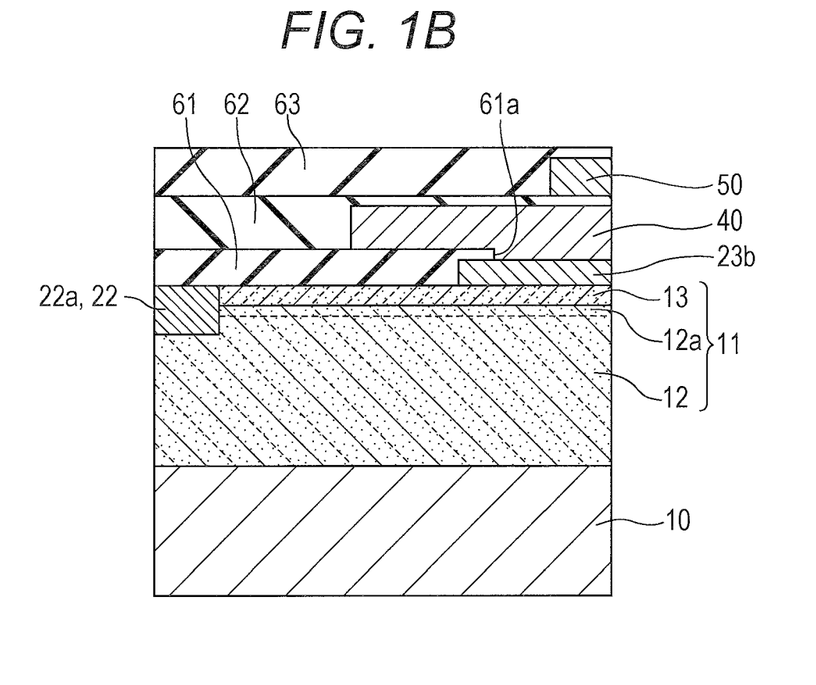
FIG. 1B is a schematic sectional view taken along line B-B in FIG. 1A.
Figure 1C:
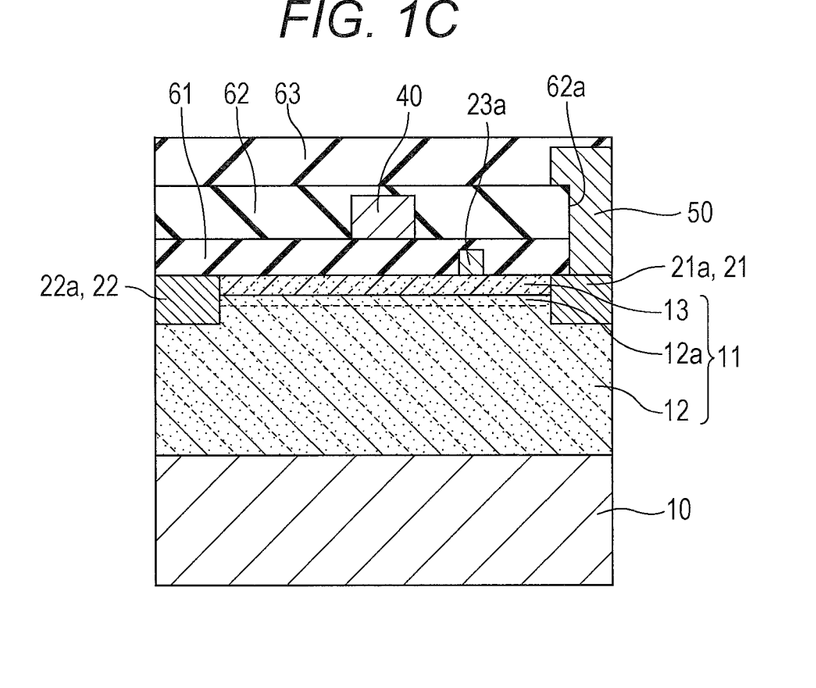
FIG. 1C is a schematic sectional view taken along line C-C in FIG. 1A.

FIG. 1A is a schematic plan view of a field-effect transistor 1 according to an embodiment. FIG. 1B is a schematic sectional view taken along line B-B in FIG. 1A. FIG. 1C is a schematic sectional view taken along line C-C in FIG. 1A. As illustrated in FIGS. 1A to 1C, the field-effect transistor 1 includes: a semiconductor structure 11 that includes an active region where a channel 12a is formed; a source electrode 21; a drain electrode 22; a gate electrode 23; and a gate external connection section 33 (external connection section) that applies power to the gate electrode 23. The field-effect transistor 1 is, for example, a high electron mobility transistor (HEMT).

Figure 2A:
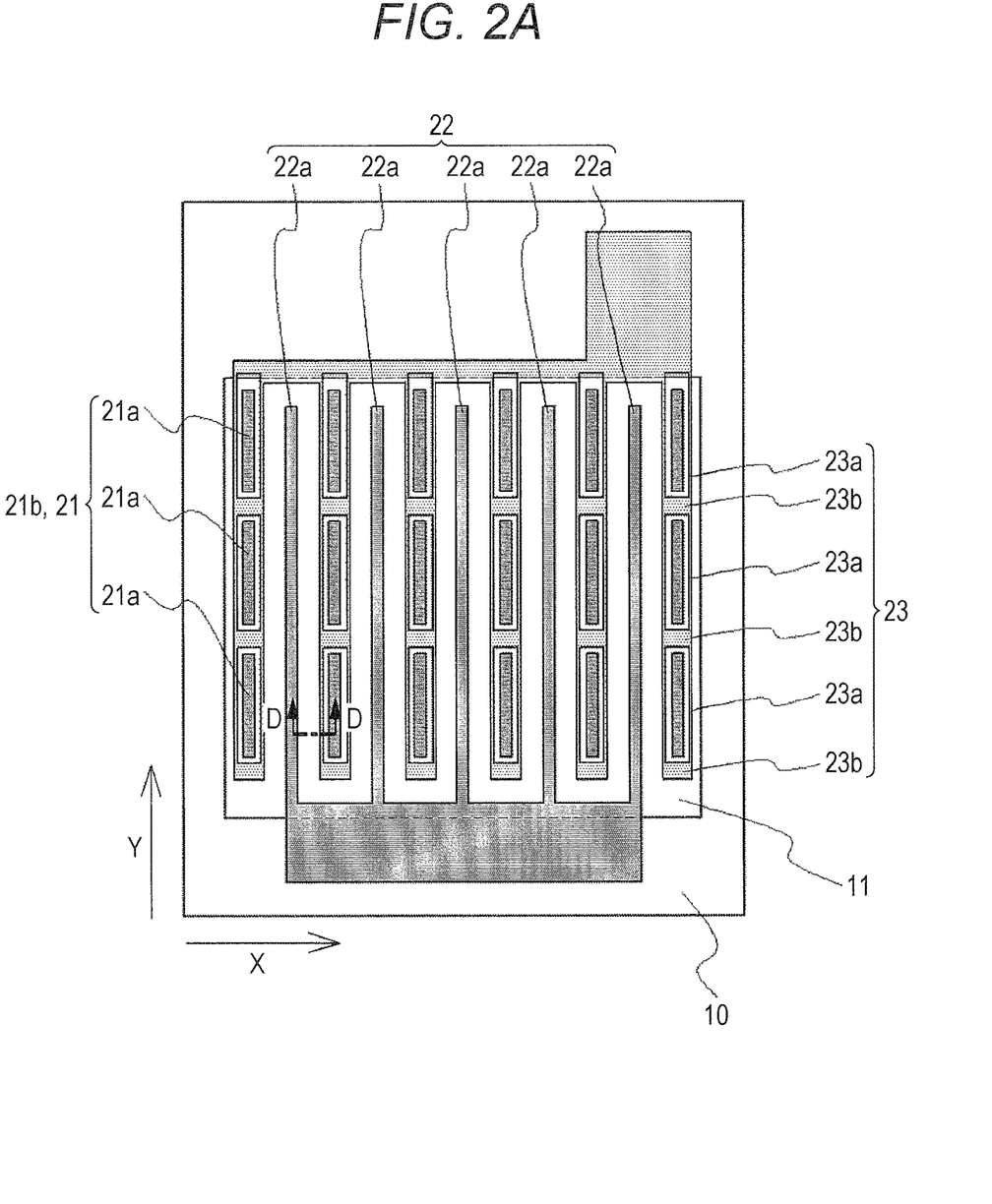
FIG. 2A is a schematic plan view illustrating a source electrode, a drain electrode, and a gate electrode each disposed on a semiconductor structure.
Figure 2B:
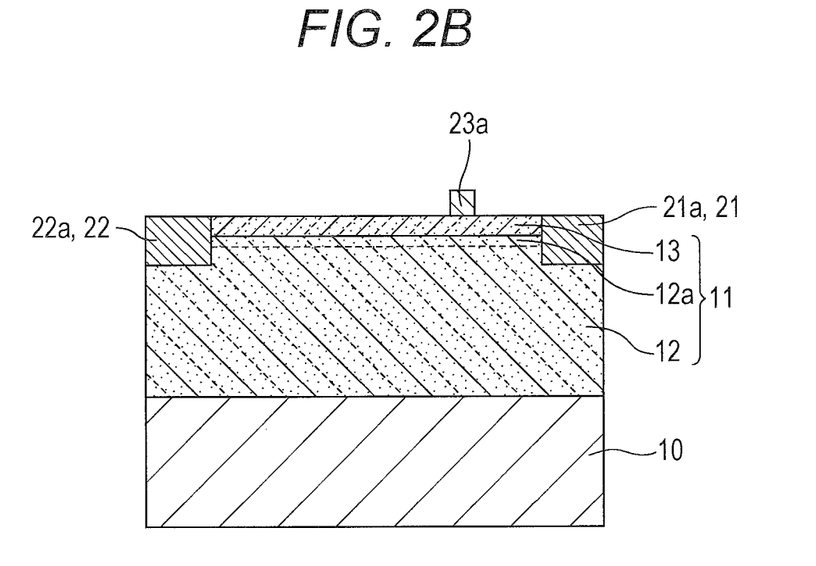
FIG. 2B is a schematic sectional view taken along line D-D in FIG. 2A.

FIG. 2A is a schematic plan view illustrating the source electrode 21, the drain electrode 22, and the gate electrode 23 each disposed on the semiconductor structure 11. FIG. 2B is a schematic sectional view taken along line D-D in FIG. 2A. As illustrated in FIG. 2A, the gate electrode 23 includes a plurality of gate main portions 23a and a plurality of connection portions 23b alternately arranged in a second direction Y intersecting with a first direction X corresponding to a direction parallel to a gate length. The gate length is a length of the gate electrode 23 in a direction in which electric current flows in a channel 12a. The gate main portions 23a are longer in length in the second direction Y than the connection portions 23b. The connection portions 23b are longer in length in the first direction X than the gate main portions 23a.

Figure 3:
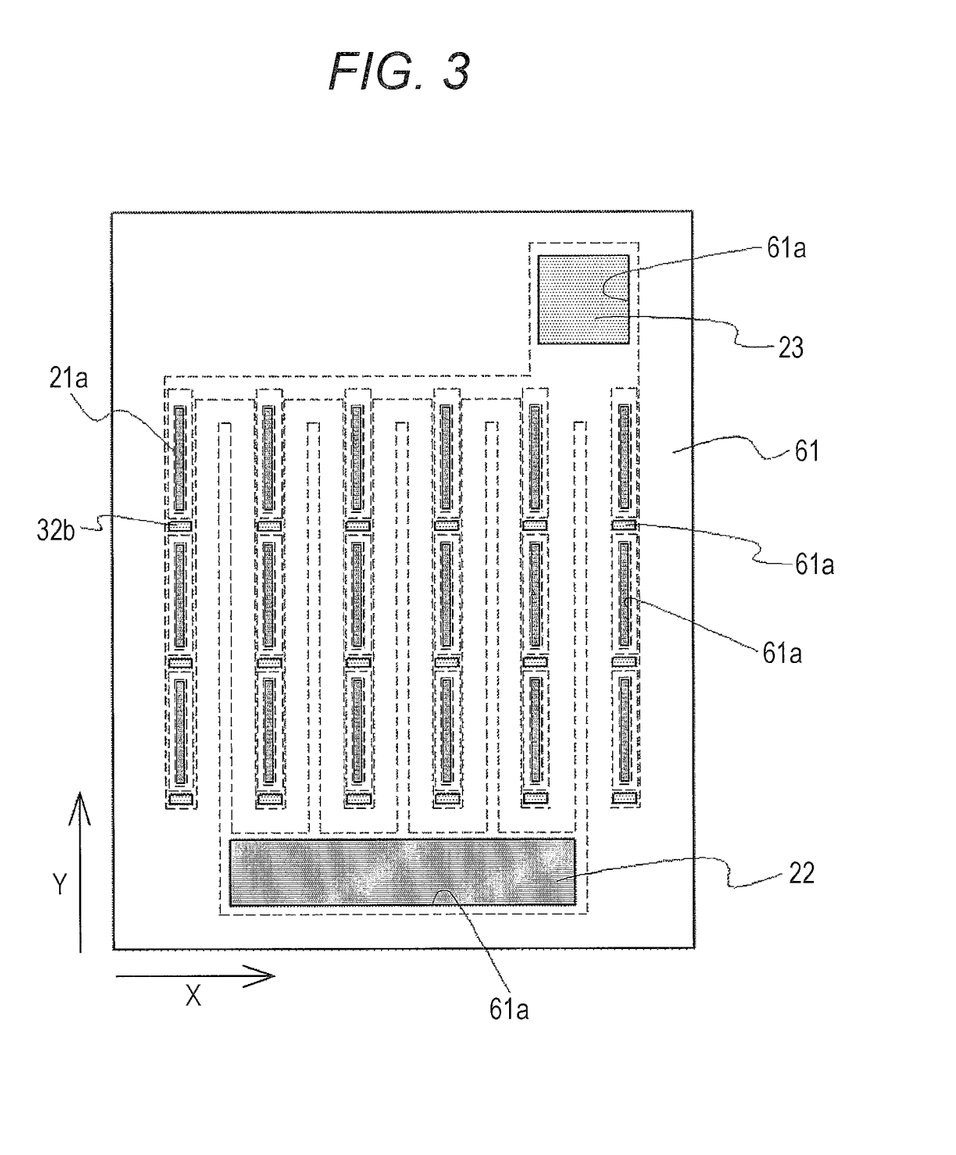
FIG. 3 is a schematic plan view illustrating a first insulating film.
Figure 4A:
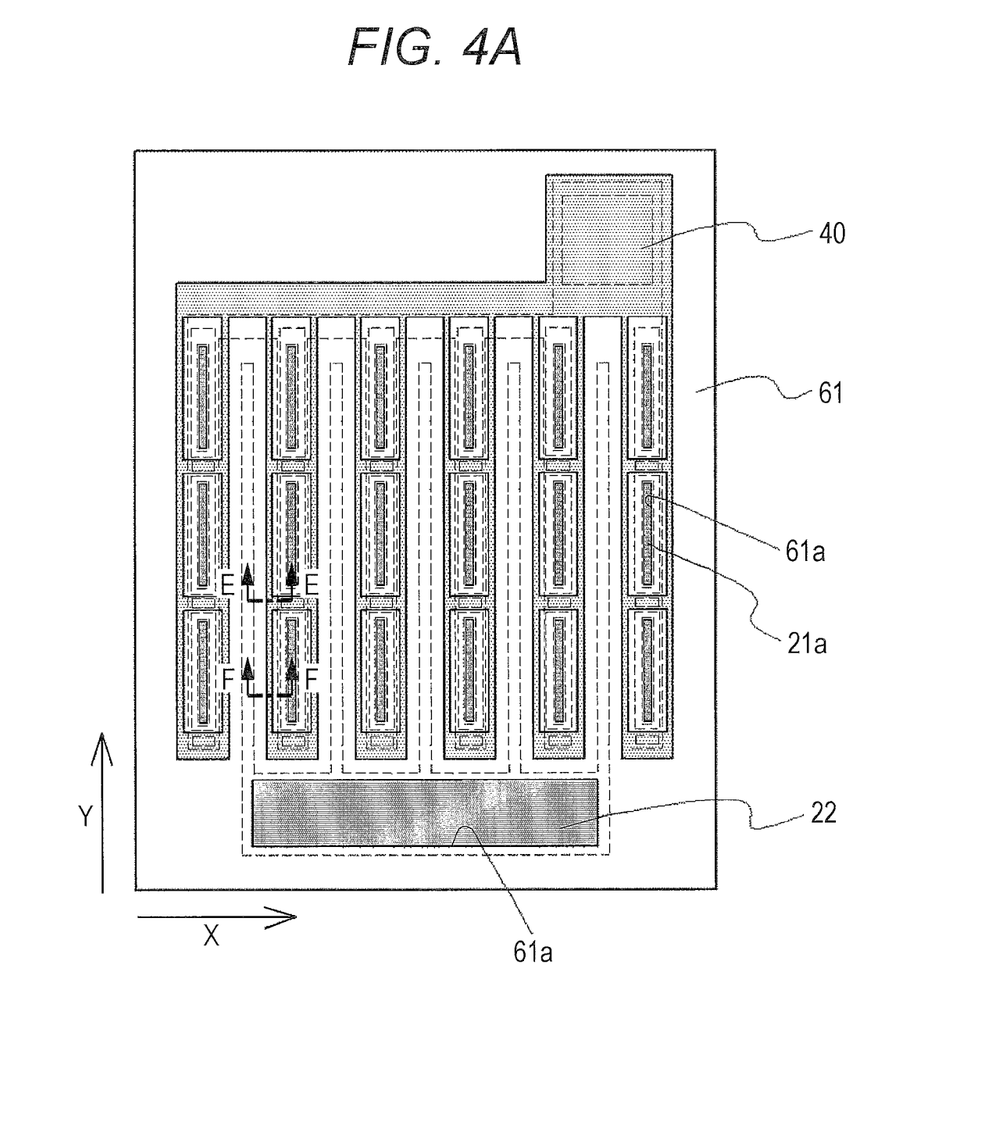
FIG. 4A is a schematic plan view illustrating a bypass electrode.
Figure 4B:
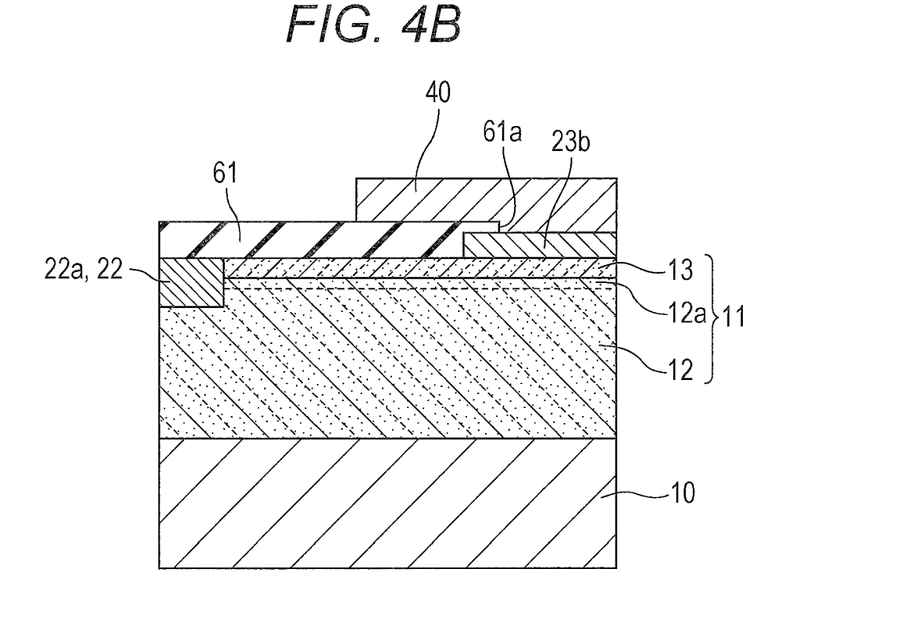
FIG. 4B is a schematic sectional view taken along line E-E in FIG. 4A.
Figure 4C:
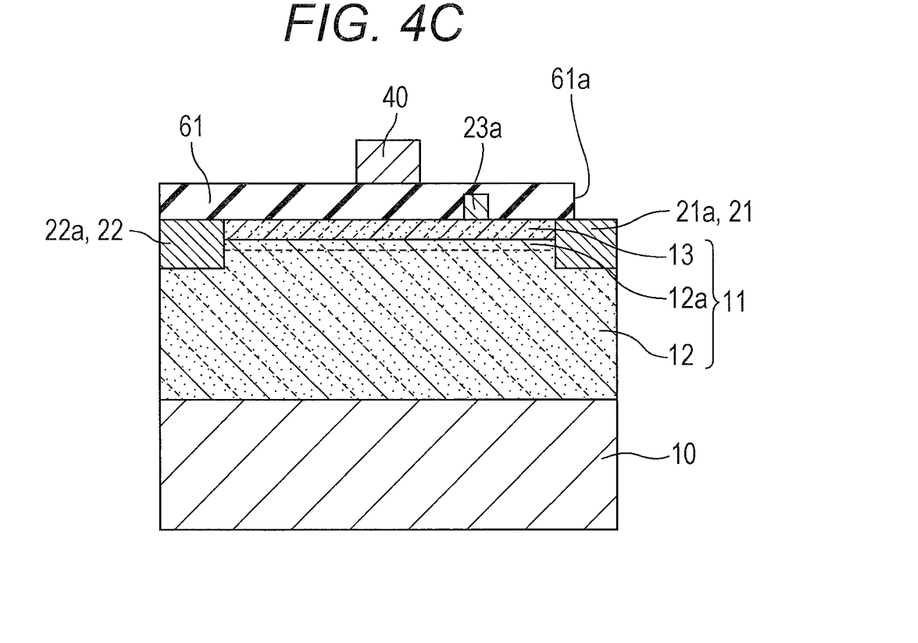
FIG. 4C is a schematic sectional view taken along line F-F in FIG. 4A.

FIG. 3 is a schematic plan view illustrating a first insulating film 61. FIG. 4A is a schematic plan view illustrating a bypass electrode 40 disposed on the first insulating film 61. FIG. 4B is a schematic sectional view taken along line E-E in FIG. 4A. FIG. 4C is a schematic sectional view taken along line F-F in FIG. 4A. As illustrated in FIGS. 1A to 4C, the field-effect transistor 1 also includes the bypass electrode 40 that extends from the gate external connection section 33. The bypass electrode 40 is directly connected to each of the connection portions 23b or is connected to each of the connection portions 23b via a connection layer. For example, the bypass electrode 40 is connected to the connection portions 23b through openings 61a formed in the first insulating film 61.

In manufacturing a plurality of field-effect transistors under the same design conditions, variations in turn-off time may result in some cases. Causes of an increase of the turn-off time in some of the field-effect transistors are uncertain. It is supposed as one of the causes that an electric potential is not uniformly and promptly transmitted all over a gate electrode 23. For example, it is considered that the existence of a delay portion, where the extension of a depletion layer is delayed due to, for example, a failure in formation of the depletion layer, at some midpoint in a gate electrode 23 gives a delay in extension of the depletion layer beyond the delay portion. It is also considered that as the number of delay portions is larger, a time until a depletion layer is satisfactorily extended all over a gate electrode 23 after input of a signal to the gate electrode 23, that is, a turn-off time becomes longer. In view of such a disadvantage, the bypass electrode 40 is provided as illustrated in FIGS. 1A to 4C so as to extend from the gate external connection section 33. This configuration enables an electric potential to be uniformly and promptly transmitted all over the gate electrode 23 by virtue of the bypass electrode 40 even when such a delay portion exists at some midpoint in the gate electrode 23. This configuration accordingly enables control of variations in turn-off time.

This configuration also avoids electric field concentration due to the delay, and therefore contributes to improvement in withstand voltage of the field-effect transistor 1. A situation in which the delay is caused refers to a situation in which a gate electrode is partially in the ON state and is partially in the OFF state. Therefore, if the delay is caused considerably, the semiconductor structure 11 and the like are susceptible to damage from the electric field concentration. However, the improvement in withstand voltage is effected since the bypass electrode 40 is provided to minimize the delay. Variations in turn-on time may also result in some cases in addition to the variations in turn-off time. Even in such a case, it is considered that the bypass electrode 40 is provided to uniformly and promptly transmit the electric potential all over the gate electrode 23, thereby controlling the variations in turn-on time.

Next, a description will be given of constituent members of the field-effect transistor 1 according to the embodiment.

Substrate 10

As illustrated in FIGS. 1A to 1C, the field-effect transistor 1 may also include a substrate 10. In this case, the semiconductor structure 11 is disposed on the substrate 10. The substrate 10 is, for example, a sapphire substrate.

Semiconductor Structure 11

The semiconductor structure 11 may be formed of a nitride semiconductor. Examples of the nitride semiconductor may include, but not limited thereto, GaN, InGaN, AlGaN, and AlN. The semiconductor structure 11 may include a first semiconductor layer 12 disposed on the substrate 10, and a second semiconductor layer 13 disposed on the first semiconductor layer 12. The first semiconductor layer 12 is formed of, for example, GaN. The second semiconductor layer 13 is larger in band gap energy than the first semiconductor layer 12. The second semiconductor layer 13 is formed of, for example, AlGaN. The second semiconductor layer 13 may include an AlN layer that is thinner than the AlGaN layer and is disposed under the AlGaN layer. The channel 12a is formed near a surface of the first semiconductor layer 12, the surface being closer to the second semiconductor layer 13. The channel 12a is, for example, a two-dimensional electron gas layer. As illustrated in FIG. 2A, for example, a part, including the channel 12a, of the semiconductor structure 11 may be removed in a region having no bearing on the function as the field-effect transistor 1 such that the substrate 10 is exposed from the region.

Source Electrode 21

The source electrode 21 is formed of, for example, Ti and Al. As illustrated in FIG. 2B, preferably, the source electrode 21 is disposed in a recess portion that is formed in the semiconductor structure 11 to reach the channel 12a. The source electrode 21 is thus brought into contact with the channel 12a. In this case, an end, closer to the gate electrode 23, of the source electrode 21 may be placed on the second semiconductor layer 13.

As illustrated in FIG. 2A, the source electrode 21 may have a source main portion group 21b that includes a plurality of source main portions 21a arranged along the second direction Y. In this case, the source main portions 21a and the connection portions 23b may be alternately arranged in the second direction Y. As described above, the source electrode 21 is partially divided, and the connection portions 23b are disposed on the divided positions. The connection portions 23b are thus disposed without changing a distance between the gate electrode 23 and the drain electrode 22. The field-effect transistor 1 thus obtains I-V characteristics almost equal to those of a field-effect transistor that is not provided with the connection portions 23b.

Figure 5:
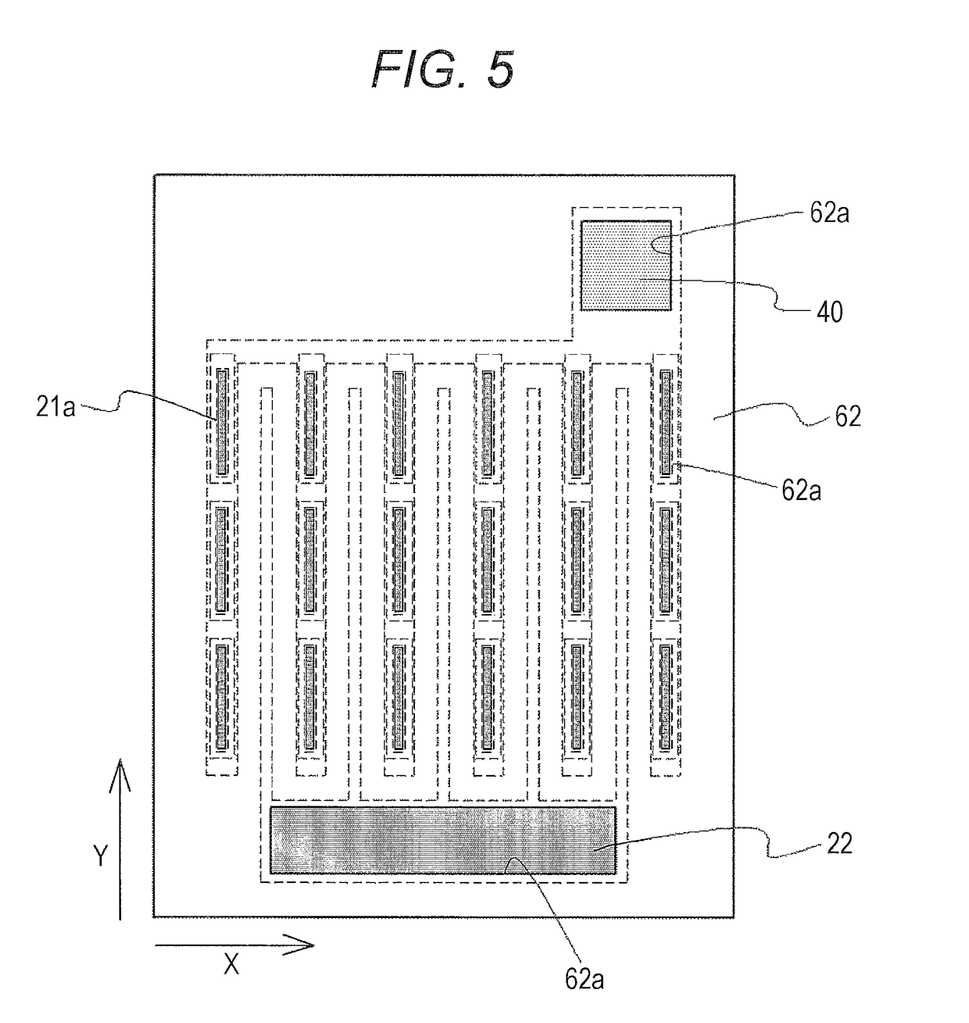
FIG. 5 is a schematic plan view illustrating a second insulating film.
Figure 6A:
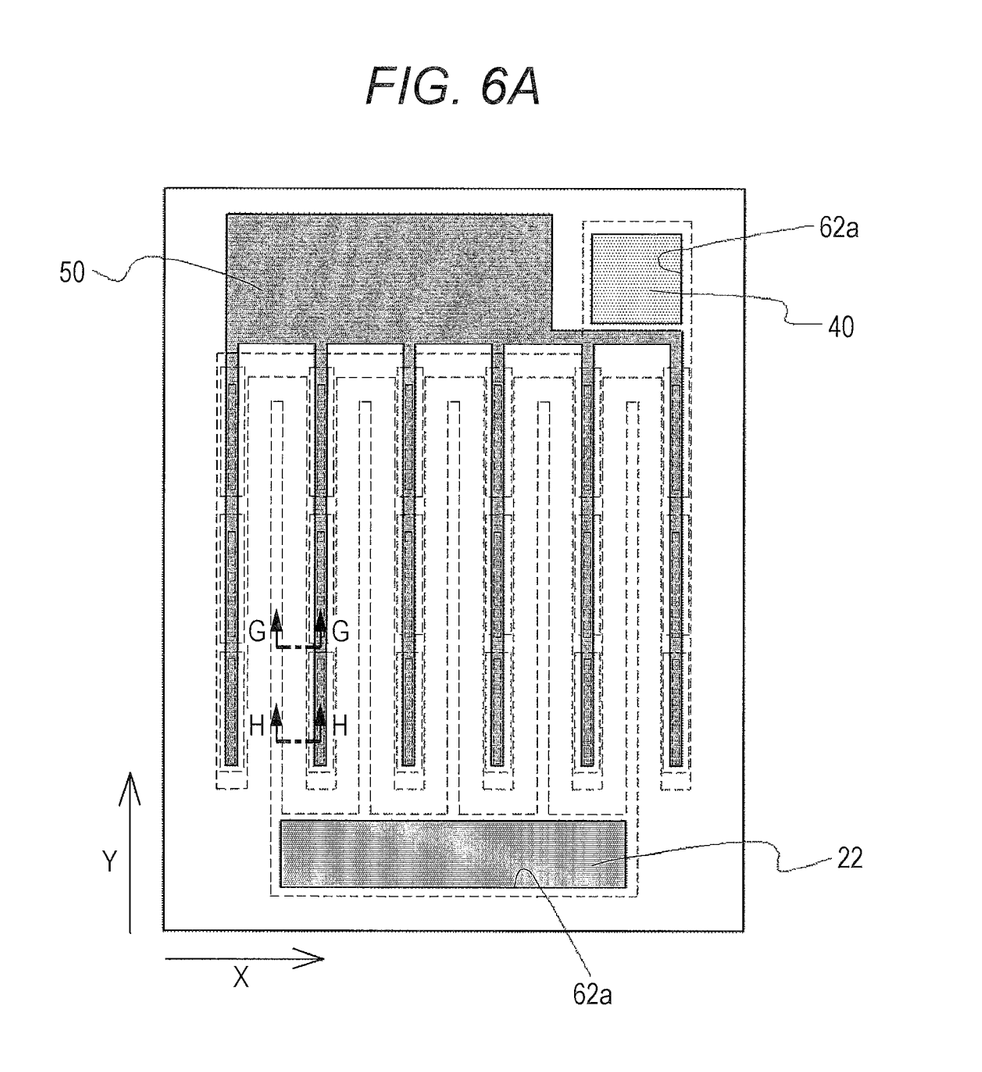
FIG. 6A is a schematic plan view illustrating a source connection layer.
Figure 6B:
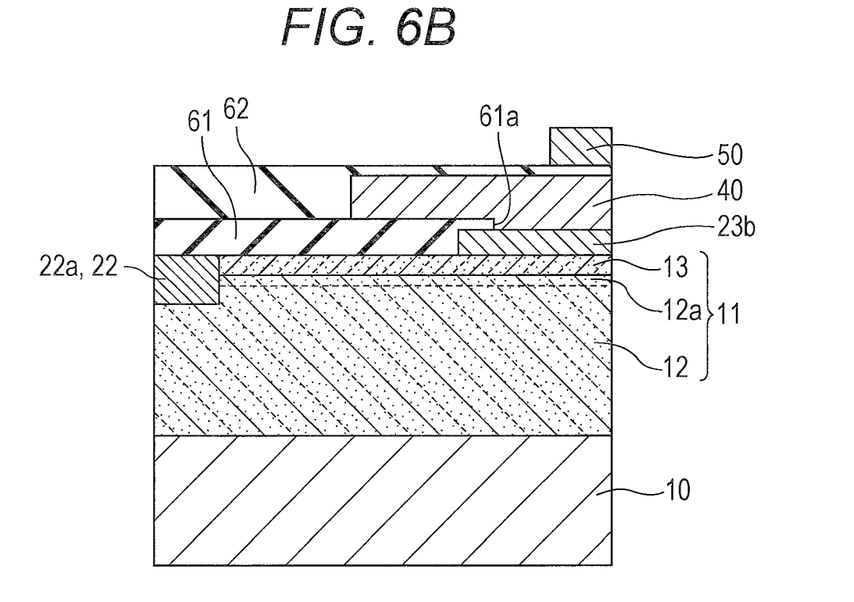
FIG. 6B is a schematic sectional view taken along line G-G in FIG. 6A.
Figure 6C:
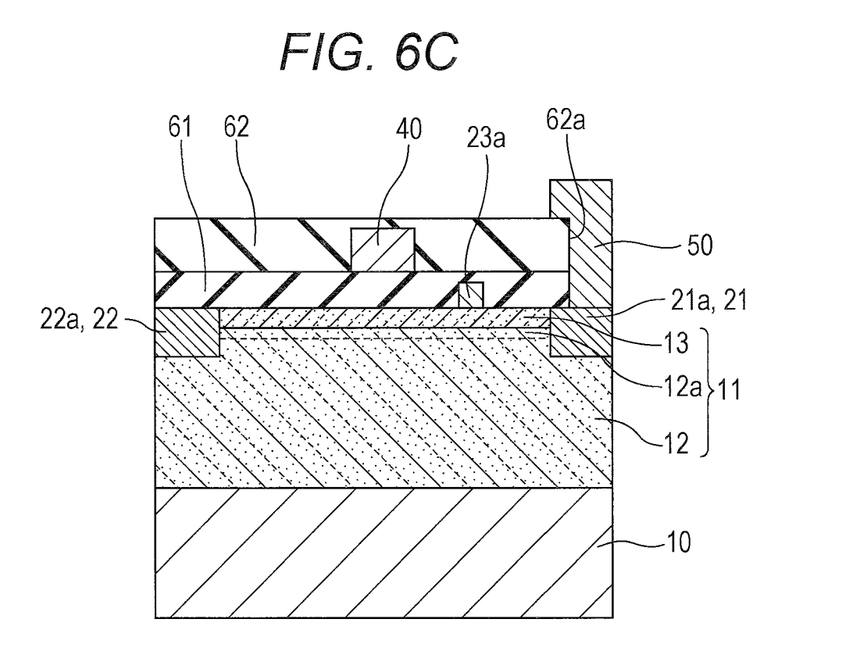
FIG. 6C is a schematic sectional view taken along line H-H in FIG. 6A.

FIG. 5 is a schematic plan view illustrating a second insulating film 62. FIG. 6A is a schematic plan view illustrating a source connection layer 50. FIG. 6B is a schematic sectional view taken along line G-G in FIG. 6A. FIG. 6C is a schematic sectional view taken along line H-H in FIG. 4A. As illustrated in FIGS. 5 to 6C, the source connection layer 50 may be formed above the plurality of source main portions 21a via the second insulating film 62. The source connection layer 50 is connected to the source main portions 21a through openings 62a formed in the second insulating film 62, so that the source main portions 21a are electrically connected to one another. As illustrated in FIGS. 1A to 1C, the source main portions 21a are electrically connected to a source external connection section 31 of the source electrode 21 via the source connection layer 50.

As illustrated in FIG. 2A, the source electrode 21 may have a plurality of source main portion groups 21b arranged in parallel to one another. Each of the source main portion groups 21b includes a plurality of source main portions 21a each extending in the second direction Y, the source main portions 21a being arranged along the second direction Y. In this case, drain main portions 22a (to be described later) and the source main portion groups 21b may be alternately arranged in the first direction X.

Drain Electrode 22

The drain electrode 22 is formed of, for example, Ti and Al. As illustrated in FIG. 2B, preferably, the drain electrode 22 is disposed in a recess portion that is formed in the semiconductor structure 11 to reach the channel 12a. The drain electrode 22 is thus brought into contact with the channel 12a. In this case, an end, closer to the gate electrode 23, of the drain electrode 22 may be placed on the second semiconductor layer 13.

As illustrated in FIG. 2A, the drain electrode 22 may include a plurality of drain main portions 22a that extend in the second direction Y and are arranged in parallel to one another. In this case, as described above, the drain main portions 22a and the source main portion groups 21b may be alternately arranged in the first direction X.

Gate Electrode 23

The gate electrode 23 is formed of, for example, Ni, Au, and Pt in this order from the semiconductor structure 11 side. For example, a gate contact layer such as a GaN layer containing p-type impurities may be disposed between the gate electrode 23 and the second semiconductor layer 13.

As illustrated in FIG. 2A, the gate electrode 23 includes the gate main portions 23a and the connection portions 23b. The gate main portions 23a are made shorter in gate length direction, and the connection portions 23b are made wider to an extent satisfactory for connection of the bypass electrode 40. As illustrated in FIGS. 3 to 4C, for example, the bypass electrode 40 is formed above the semiconductor structure 11 via the first insulating film 61.

It is considered that such delay portions as described above are distributed on an irregular basis. An influence of the delay portions is accordingly minimized as a distance between two of the connection portions 23b is shorter, so that variations in turn-off time are controlled with ease. Specifically, a length of each gate main portion 23a in the second direction Y is preferably equal to or less than 0.5 mm.

As illustrated in FIG. 2A, on the other hand, in the case where the source electrode 21 is divided and the connection portions 23b are disposed on the divided positions, the number of connection portions 23b increases as a distance between two of the connection portions 23b is shorter, so that an area of the source electrode 21 is relatively reduced. Typically, on resistance tends to increase as an area of the source electrode 21 is smaller. Accordingly, the length of each gate main portion 23a in the second direction Y is preferably equal to or more than 0.1 mm.

As illustrated in FIG. 2A, in the case where the source electrode 21 has the source main portion groups 21b, preferably, the connection portions 23b are arranged on an opposite side from the gate external connection section 33 in each of the source main portion groups 21b. In other words, the connection portions 23b are preferably arranged on an end of the gate electrode 23. This configuration enables an electric potential to be uniformly and promptly transmitted all over the gate electrode 23 with higher reliability.

As illustrated in FIG. 2A, in the field-effect transistor 1, preferably, the gate electrode 23 and the drain electrode 22 are evenly spaced. This configuration reduces occurrence of local electric field concentration between the gate electrode 23 and the drain electrode 22 and improves the withstand voltage of the field-effect transistor 1. In order that the gate electrode 23 and the drain electrode 22 are substantially evenly spaced, as illustrated in FIG. 2A, preferably, outer edges, closer to the drain electrode 22, of the connection portions 23b and outer edges, closer to the drain electrode 22, of the gate main portions 23a are arranged linearly.

The gate electrode 23 may satisfy the following relationships as to the gate main portions 23a and the connection portions 23b. The gate electrode 23 includes a plurality of connection portions 23b, and a gate main portion 23a that extends to connect the connection portions 23b to each other. As to the connection portions 23b and the gate main portion 23a that are adjacent to each other, the gate main portion 23a is longer in length in the extending direction of the gate main portion 23a than the connection portions 23b. Moreover, the connection portions 23b are longer in length in the gate length direction of the gate main portion 23a than the gate main portion 23a.

Bypass Electrode 40

As illustrated in FIGS. 1A to 1C, the bypass electrode 40 is connected to the gate external connection section 33. The bypass electrode 40 may be disposed above the semiconductor structure 11 via the first insulating film 61. As illustrated in FIGS. 4A to 4C, for example, the bypass electrode 40 may be formed in a shape extending along the gate electrode 23 as seen in plan view. The situation in which the bypass electrode 40 is connected to the gate external connection section 33 refers to a situation in which the bypass electrode 40 is directly connected to a portion to which an external connection member such as a metal wire is connected. As illustrated in FIGS. 1A to 1C, for example, the bypass electrode 40 is partially exposed from an opening 63a in a third insulating film 63, and this exposed portion may serve as the gate external connection section 33. Likewise, the gate electrode 23 is partially exposed from an opening 63a in the third insulating film 63, and this exposed portion may serve as the gate external connection section 33. Alternatively, a conductive member different from the gate electrode 23 and the bypass electrode 40 may be provided to serve as the gate external connection section 33. In these cases, a contact for electrically connecting the bypass electrode 40 to the gate external connection section 33 is disposed near the gate external connection section 33. For example, the contact is disposed at any position from the gate external connection section 33 to the gate main portions 23a on the semiconductor structure 11.

The bypass electrode 40 preferably satisfies at least one of the following conditions: the bypass electrode 40 is longer in length in the first direction X than the gate main portions 23a; the bypass electrode 40 is larger in thickness than the gate main portions 23a; and the bypass electrode 40 is formed of a material higher in electric conductivity than a material for the gate main portions 23a. As described above, the bypass electrode 40 that is superior in electric conductivity to the gate main portions 23a is provided to uniformly and promptly transmit an electric potential all over the gate electrode 23 with higher reliability.

The bypass electrode 40 may additionally serve as a field plate electrode. As illustrated in FIGS. 4A to 4C, specifically, the bypass electrode 40 is partially disposed, via the first insulating film 61, above the semiconductor structure 11 located between the gate electrode 23 and the drain electrode 22 each disposed on an upper surface of the semiconductor structure 11. When the bypass electrode 40 is disposed as described above, an electric field from the bypass electrode 40 alleviates electric field concentration between the gate electrode 23 and the drain electrode 22. Electrons are accordingly less prone to being captured by an electron trap on a surface of the semiconductor structure 11, so that occurrence of a collapse phenomenon is reduced and a rise in on resistance is thus lessened.

Examples 1 to 3

Field-effect transistors 1 of Examples 1 to 3 were prepared as follows. A semiconductor structure 11 that includes a buffer layer, an approximately 600 nm-thick undoped GaN layer, an approximately 0.9 nm-thick undoped AlN layer, an approximately 8 nm-thick undoped AlGaN layer, an approximately 10 nm-thick p-type GaN layer, an approximately 20 nm-thick undoped GaN layer, and an approximately 20 nm-thick undoped AlGaN layer stacked in this order was formed on a substrate 10 made of sapphire. As a gate electrode 23, Ni (thickness: approximately 800 nm) was formed on a surface of the undoped AlGaN layer. The three layers from the undoped AlGaN layer as the uppermost layer to the p-type GaN layer were removed except a region immediately under the gate electrode 23. In a region where a source electrode 21 and a drain electrode 22 are formed, the semiconductor structure 11 was partially removed so that an interface between the undoped GaN layer and the undoped AlN layer was exposed, and the source electrode 21 and the drain electrode 22 were formed to cover the interface. Each of the source electrode 21 and the drain electrode 22 was a stack of Ti (thickness: approximately 10 nm) and Al (thickness: approximately 300 nm) formed in this order from the substrate 10 side.

The source electrode 21 was formed to have 26 source main portion groups 21b each including a plurality of source main portions 21a, and the drain electrode 22 was fainted to include 25 drain main portions 22a. The source main portion groups 21b and the drain main portions 22a were arranged in parallel to each other in a region (approximately 1 mm×approximately 1 mm) on the semiconductor structure 11. The gate electrode 23 was formed to include gate main portions 23a and connection portions 23b. In one source main portion group 21b, each connection portion 23b was disposed between two of the source main portions 21a, and each gate main portion 23a was disposed at a position connecting two of the connection portions 23b to each other.

In addition, an approximately 600 nm-thick $SiO_2$ film having an opening was fainted as a first insulating film 61 to cover a surface of the semiconductor structure 11 and the respective electrodes on the semiconductor structure 11, and an approximately 470 nm-thick bypass electrode 40 made of Ni, Pt, and Ni was formed on the $SiO_2$ film. The first insulating film 61 was formed to have openings 61a from which the connection portions 23b are exposed, and the bypass electrode 40 was connected to the connection portions 23b through the openings 61a.

A length of each source main portion 21a in a first direction X was set at approximately 5 μm, and a length of each source main portion group 21b in a second direction Y was set at approximately 1 mm. A length of each drain main portion 22a in the first direction X was set at approximately 5 μm, and a length of each drain main portion 22a in the second direction Y was set at approximately 1 mm. A gate length of each gate main portion 23a was set at approximately 1 μm. A length of each connection portion 23b in the first direction X was set at approximately 11 μm, and a length of each connection portion 23b in the second direction Y was set at approximately 20 μm. A length of a portion, which extends in parallel to the gate main portions 23a, of the bypass electrode 40 in the first direction X was set at approximately 4 μm. A length of each gate main portion 23a in the second direction Y, that is, a distance between two of the connection portions 23b was set at approximately 0.5 mm in Example 1, was set at approximately 0.25 mm in Example 2, and was set at 0.1 mm in Example 3. The field-effect transistors 1 of Examples 1 to 3 were manufactured with the same lot.

Examples 4 and 5

Field-effect transistors 1 of Examples 4 and 5 were respectively prepared in manners similar to those in Examples 2 and 3 except that the field-effect transistors of Examples 4 and 5 are different in lot from the field-effect transistors of Examples 2 and 3. Specifically, the field-effect transistors 1 of Examples 4 and 5 were manufactured with the same lot. A length of each gate main portion 23a in a second direction Y was set at approximately 0.25 mm in Example 4, and was set at 0.1 mm in Example 5.

Comparative Example 1

A field-effect transistor of Comparative Example 1 was prepared in a manner similar to that in Example 1 except that the field-effect transistor of Comparative Example 1 is not provided with connection portions 23b. In other words, source main portions 21a were not separated from one another, and a field plate electrode was formed instead of the bypass electrode 40 so as to extend in parallel to gate main portions 23a without being in contact with the gate main portions 23a. The field-effect transistor of Comparative Example 1 was manufactured with the same lot as that for use in manufacturing the field-effect transistors 1 of Examples 1 to 3.

Comparative Example 2

A field-effect transistor of Comparative Example 2 was prepared in a manner similar to that in Comparative Example 1 except that the field-effect transistor of Comparative Example 2 is different in lot from the field-effect transistor of Comparative Example 1. The field-effect transistor of Comparative Example 2 was manufactured with the same lot as that for use in manufacturing the field-effect transistors 1 of Examples 4 and 5.

Experimental Results

Figure 7:
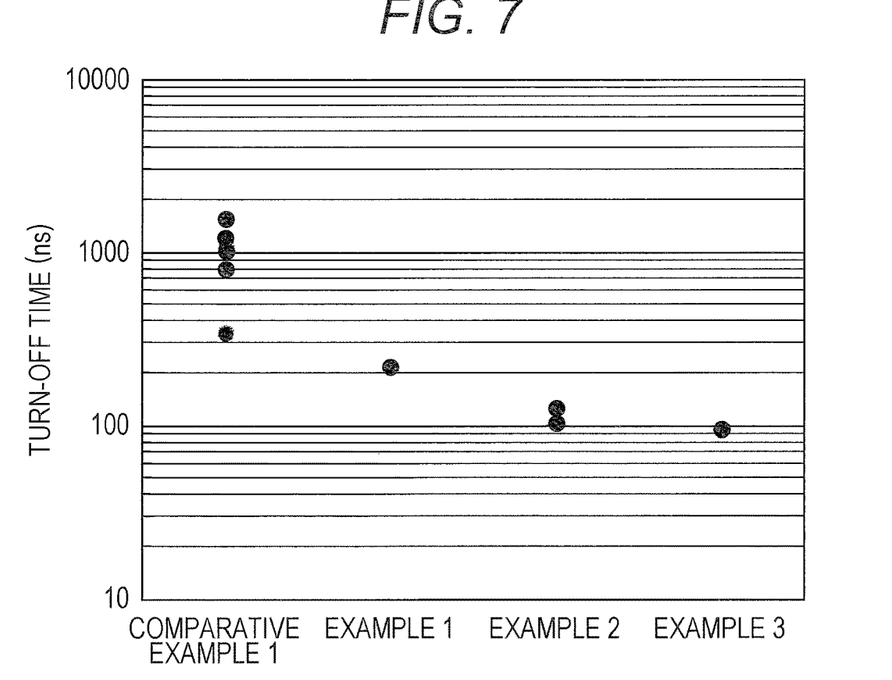
FIG. 7 is a graph showing results of measurement on a turn-off time as to field-effect transistors of Examples 1 to 3 as well as a field-effect transistor of Comparative Example 1.
Figure 8:
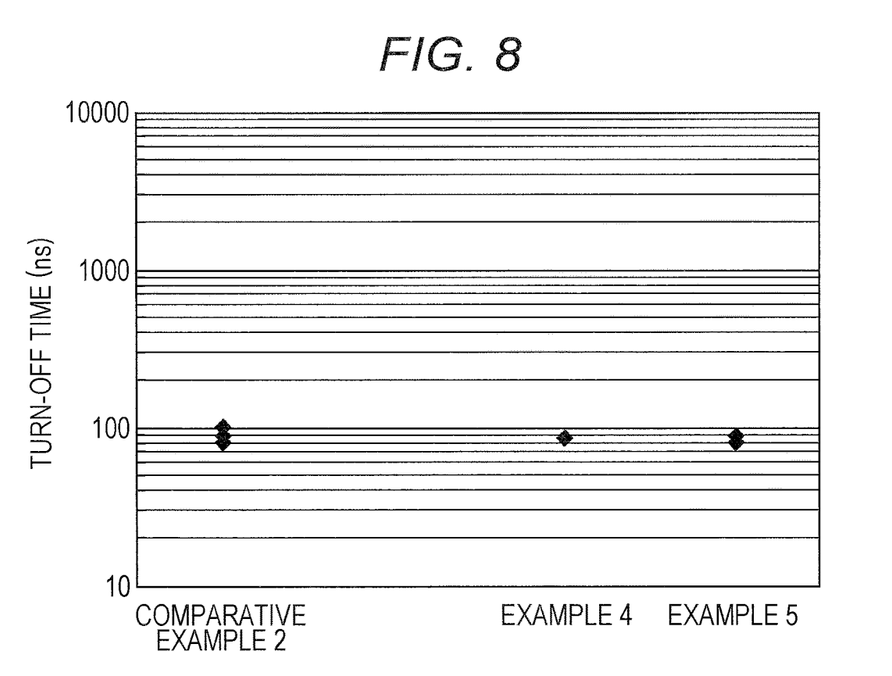
FIG. 8 is a graph showing results of measurement on a turn-off time as to field-effect transistors of Examples 4 and 5 as well as a field-effect transistor of Comparative Example 2.

FIG. 7 shows results of measurement on a turn-off time as to the field-effect transistors of Examples 1 to 3 as well as the field-effect transistor of Comparative Example 1. FIG. 8 shows results of measurement on a turn-off time as to the field-effect transistors of Examples 4 and 5 as well as the field-effect transistor of Comparative Example 2. FIGS. 7 and 8 each show the results of measurement as to one to seven field-effect transistors manufactured under the respective conditions. In FIGS. 7 and 8, one circular or rectangular mark corresponds to a result of measurement as to one field-effect transistor.

As shown in FIGS. 7 and 8, although the turn-off time of each field-effect transistor of Comparative Example 1 was around 1000 nanoseconds, the turn-off time of each field-effect transistor of Comparative Example 2 was around 100 nanoseconds. The field-effect transistors of Comparative Example 2 were manufactured with the lot of which the turn-off time is shorter. In this case, as shown in FIG. 8, the turn-off times in each of Examples 4 and 5 were almost equal to the turn-off times in Comparative Example 2. On the other hand, the field-effect transistors of Comparative Example 1 were manufactured with the lot of which the turn-off time is longer. In this case, as shown in FIG. 7, the turn-off time of each field-effect transistor 1 of Example 1 was about 200 nanoseconds, and the turn-off time of each of the field-effect transistors 1 of Examples 2 and 3 was about 100 nanoseconds. As described above, by virtue of the bypass electrode 40 connected to the connection portions 23*b*, the turn-off times were shortened in the lot of which the turn-off time is longer, so that the variations in turn-off time were controlled.

Obviously, numerous modifications and variations of the present invention are possible in light of the above teachings. It is therefore to be understood that within the scope of the appended claims, the invention may be practiced otherwise than as specifically described herein.

What is claimed is:

1. A field-effect transistor comprising:
a source electrode including source main portions arranged in a line extending in a lengthwise direction;
a drain electrode including a drain main portion provided substantially in parallel to the source main portions and extending in the lengthwise direction;
a semiconductor structure provided on the source main portions and the drain main portion to constitute a channel between each of the source main portions and the drain main portion in a gate length direction intersecting with the lengthwise direction;
a gate electrode longitudinally extending in the lengthwise direction, the gate electrode having a first end and a second end opposite to the first end in the lengthwise direction, the gate electrode comprising:
gate main portions provided on the semiconductor structure substantially in parallel to the source main portions respectively such that each of the gate main portions is provided between each of the source main portions and the drain main portion in the gate length direction, each of the gate main portions having a first gate main portion length in the gate length direction and a second gate main portion length in the lengthwise direction; and
connection portions alternately arranged between and connected in series to adjacent gate main portions of the gate main portions in the lengthwise direction,
each of the connection portions having a first connection portion length in the gate length direction and a second connection portion length in the lengthwise direction, the first connection portion length being longer than the first gate main portion length, the second connection portion length being shorter than the second gate main portion length;
an external connection section connected to the first end of the gate electrode to apply electric power to the gate electrode; and
a bypass electrode connecting the external connection section to each of the connection portions and being electrically connected to the gate main portions,
wherein the drain electrode includes an additional drain main portion extending in the lengthwise direction and arranged substantially in parallel to the drain main portion,
wherein the source electrode includes additional source main portions arranged in parallel with the source main portions, respectively, and
wherein the gate electrode further comprises additional gate main portions and additional connection portions alternately arranged between and connected in series to adjacent additional gate main portions of the additional gate main portions in the lengthwise direction, the additional gate main portions being provided on the semiconductor structure substantially in parallel to the additional source main portions respectively such that each of the additional gate main portions is provided between each of the additional source main portions and the additional drain main portion in the gate length direction.

2. The field-effect transistor according to claim 1, wherein the first gate main portion length is a gate length of the channel.

3. The field-effect transistor according to claim 1, wherein the bypass electrode is directly connected to each of the connection portions.

4. The field-effect transistor according to claim 1, wherein the bypass electrode is connected to each of the connection portions via another layer.

5. The field-effect transistor according to claim 1, wherein the gate length direction is substantially perpendicular to the lengthwise direction.

6. The field-effect transistor according to claim 1, wherein the bypass electrode has a first bypass electrode length in the gate length direction which is longer than the first gate main portion length.

7. The field-effect transistor according to claim 1, wherein the bypass electrode has a thickness larger than thicknesses of the gate main portions in a thickness direction perpendicular to the lengthwise direction and the gate length direction.

8. The field-effect transistor according to claim 1, wherein the bypass electrode is made of a material having higher electric conductivity than a material of which the gate main portions are made.

9. The field-effect transistor according to claim 1,
wherein the gate electrode and the drain electrode are disposed on an upper side of the semiconductor structure, and
wherein the bypass electrode has a portion between the gate electrode and the drain electrode in the gate length direction such that an insulating film is sandwiched between the portion and the upper side of the semiconductor structure.

10. The field-effect transistor according to claim 1, wherein the second gate main portion length is equal to or less than 0.5 mm.

11. The field-effect transistor according to claim 1, wherein the line is a straight line.

\* \* \* \* \*